United States Patent [19]
Kato

[11] Patent Number: 6,140,989
[45] Date of Patent: Oct. 31, 2000

[54] IMAGE SIGNAL CONTROL CIRCUIT WHICH CONTROLS IMAGE SIGNAL FOR DISPLAYING IMAGE ON MULTI-GRADATION LIQUID CRYSTAL DISPLAY AND CONTROL METHOD THEREFOR

[75] Inventor: Fumihiko Kato, Tokyo, Japan

[73] Assignee: Nec Corporation, Tokyo, Japan

[21] Appl. No.: 08/800,127

[22] Filed: Feb. 13, 1997

[30] Foreign Application Priority Data

Feb. 14, 1996 [JP] Japan .................................. 8-027075

[51] Int. Cl.[7] ...................................................... G09G 3/36
[52] U.S. Cl. ................................................ 345/89; 345/96
[58] Field of Search ................................. 345/87, 89, 96, 345/150, 153, 147; 341/145, 136; 358/302

[56] References Cited

U.S. PATENT DOCUMENTS

| | | | |
|---|---|---|---|
| 3,823,396 | 7/1974 | Lode | 341/145 |
| 5,097,342 | 3/1992 | Agano | 358/302 |
| 5,168,270 | 12/1992 | Masumoni et al. | 345/137 |
| 5,283,580 | 2/1994 | Brooks et al. | 341/145 |
| 5,287,092 | 2/1994 | Shiraishi | 345/137 |
| 5,508,702 | 4/1996 | Estrada et al. | 341/136 |
| 5,650,784 | 7/1997 | Hikosaka et al. | 341/139 |

FOREIGN PATENT DOCUMENTS

| | | |
|---|---|---|
| 0170224A2 | 2/1986 | European Pat. Off. . |
| 0477100A1 | 3/1992 | European Pat. Off. . |
| 0510696A1 | 10/1992 | European Pat. Off. . |
| 3-203777 | 9/1991 | Japan . |
| 5-40451 | 2/1993 | Japan . |
| 2217128A | 10/1989 | United Kingdom . |

*Primary Examiner*—Steven J. Saras
*Assistant Examiner*—Fritz Alphonse
*Attorney, Agent, or Firm*—Sughrue, Mion, Zinn, Macpeak & Seas, PLLC

[57] ABSTRACT

An image signal control circuit including a digital-to-analog conversion circuit with a first reference voltage terminal to be supplied with a predetermined voltage value, and second and third reference voltage terminals to be supplied with gradation voltage values The digital-to-analog conversion circuit also has a switching unit for outputting one value of gradated analog gradation data obtained by the division of the gradation voltage, a control circuit for selectively operating the switching unit based on digital image data, sample hold input clock and frame input clock, so as to switch the polarity of an output signal of the digital-to-analog conversion circuit at every frame period.

18 Claims, 10 Drawing Sheets

IMAGE SIGNAL CONTROL CIRCUIT WHICH CONTROLS IMAGE SIGNAL FOR DISPLAYING IMAGE ON MULTI-GRADATION LIQUID CRYSTAL DISPLAY AND CONTROL METHOD THEREFOR

BACKGROUND OF THE INVENTION

1. Field of the Invention

The present invention relates to a control circuit which controls an image signal for displaying image on a multi-gradation liquid crystal display and a controlling method therefor and, more particularly, to an image signal control circuit which inverts the polarity of an image signal to be applied to liquid crystal at every horizontal synchronization period and a controlling method therefor.

2. Description of the Related Art

In a multi-gradation liquid crystal display, a driving circuit is provided for driving source lines (column line) and gate lines (row line) arranged in a two-dimensional matrix on the display. A source driving circuit for driving a source line supplies a source line with an electric signal corresponding to gradation image data. Then, with a gate driving circuit sequentially selecting and driving a gate line, gradation data is sent to each pixel of the display. This operation is repeated at every selection of each gate line. In a case of such one-line one-scan driving system, a period from the selection of one row to the selection of the next row is referred to as a horizontal synchronization period. A period from when sequential selection of gate lines starts at from the uppermost row to the lowermost row in the two-dimensional matrix on a display panel until when selection of the uppermost row gate line starts again is referred to as a vertical synchronization period or one frame period.

In general, digital image data supplied from an information processor such as a personal computer or the like is subjected to various image processing and then sent to a source driving circuit as analog image data which is analog-gradated by a D/A conversion circuit (digital-to-analog conversion circuit). The analog image data sent to the source driving circuit is sent therefrom as analog pixel data to each pixel through a source line during a horizontal synchronization period. Proposed as a circuit which implements conversion of this pixel data to be written on an arbitrary pixel on a display panel by a source driving circuit from digital data to analog data is such a D/A conversion circuit as shown in FIG. 10.

As illustrated in FIG. 10, the D/A conversion circuit includes a differential input type operation amplifier OP, a first switch SW α and a capacitor denoted by a capacitance value $2^{a}C$ connected in parallel between an output terminal and a negative input terminal of the differential input type operation amplifier OP, and a number a+1 of capacitors, C, $2^0 C, 2^1 C, \sim, 2^{a-2}C$, and $2^{a-1}C$ (C denotes a unit capacitance value) connected in parallel to the negative input terminal of the differential input type operation amplifier OP. A positive input terminal of the differential input type operation amplifier OP is connected to a first reference voltage terminal Vref. Of the above-described capacitors, each of the others of the respective ends of a number a of the capacitors, $2^0C$, $2^1C, \sim, 2^{a-2}C$ and $2^{a-1}C$ is connected to each of ones of the respective ends of a number a of switch groups in which switches SW1-SWa and switches SW1n-SWan are paired respectively. The others of the respective ends of the switches SW1-SWa are connected to a second reference voltage terminal V(m+1). The others of the respective ends of the switches SW1n-Swan are connected to a third reference voltage terminal Vm through a switch SWβ as well as to the first reference voltage terminal Vref through a switch SWβn. In addition, the capacitor with the capacitance value C is connected to the third reference voltage terminal Vm through the switch SWβ as well as to the first reference voltage terminal Vref through the switch SWβn.

A thus structured conventional D/A conversion circuit selects two values out of 8 to 10 gradations of analog gradation voltages whose γ correction has been already completed outside a driving circuit according to optical characteristics of liquid crystal and applies the selected two values of analog gradation voltages to the reference terminals Vm and V(m+1). Responsively, selective operation of the first to third switches and a number a of switch groups in a not-shown D/A converter control circuit results in multi-division of the analog gradation voltage is to multi-gradate gradation data. Then, one value of the multi-gradated gradation data is output as analog image data and the image data is supplied to a pixel through a source line.

Common liquid crystal displays perform displaying while inverting the polarity to be applied to liquid crystal at every one horizontal synchronization period in order to improve image quality. Conventional driving techniques using the D/A conversion circuit shown in FIG. 10 accordingly need to invert the polarity of 8 to 10 gradations of analog voltage values whose γ correction has been conducted at every one horizontal synchronization period. It is therefore necessary to invert the polarity of a voltage value to be supplied to the reference voltage terminals Vm, and V(m+1).

Inverting the polarity of a voltage value supplied from the outside of a driving circuit, however, is a great burden to a liquid crystal driving system and requires large power consumption.

SUMMARY OF THE INVENTION

An object of the present invention is to provide an image signal control circuit which realizes reduction in circuit scale and reduction of power consumption in a liquid crystal driving system by enabling a reference voltage to be output with a reverse polarity without arrangement for inverting the polarity of a γ corrected analog gradation voltage value.

According to one aspect of the invention, an image signal control circuit for converting digital image data into analog image data and sending the data to source driving means for driving a source line of a multi-gradation liquid crystal display, comprising:

digital-to-analog conversion means having a first reference voltage terminal to be supplied with a predetermined voltage value and second and third reference voltage terminals to be supplied with a gradation voltage value for the voltage value applied to the first reference voltage terminal for outputting, as analog image data, one value of gradated analog gradation data obtained by the division of the gradation voltage, and control means for receiving input of digital image data, sample hold input clock and frame input clock and controlling said digital-to-analog conversion means based on the applied data and both clocks to switch the polarity of said analog image data output from said digital-to-analog conversion means at every frame period.

In the preferred construction, the digital-to-analog conversion means comprises a differential input type operation amplifier having a positive input terminal connected to said first reference voltage terminal, a first capacitor having a predetermined capacitance and connected to a negative input terminal of said differential input type operation amplifier, first and second switches for selectively switching and supplying a gradation voltage value applied to said third reference voltage terminal or a voltage value applied to said first reference voltage terminal to said first capacitor, data output switching means for selectively switching and supplying gradation voltage values applied to said second and third reference voltage terminals to the negative input terminal of said differential input type operation amplifier to selectively output said analog image data, and a third switch and a second capacitor having a predetermined capacitance value connected in parallel between the output terminal and the negative input terminal of said differential input type operation amplifier, the data output switching means including groups, as many as the number corresponding to the number of bits of digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and the control means comprises an exclusive OR gate responsive to sample hold input clock and frame input clock for conducting logical operation, and NAND gates connected in parallel to an output end of said exclusive OR gate and as many as the number of groups of said third capacitor and said fourth and fifth switches of said switching means, the exclusive OR gate supplying output to said NAND gates, as well as branching the output into two, and after inverting the polarity of only one output, supplying the two outputs as driving signals of said first and second switches to said digital-to-analog conversion means, and the NAND gates each receiving input of its corresponding digital image data and output of said exclusive OR gate, branching the output into two, and after inverting the polarity of only one output, supplying the two outputs as driving signals of their corresponding said fourth and fifth switches of said switching means to said data output switching means of said digital-to-analog conversion means.

In the preferred construction, a length of a period from a rise to a fall of said frame input clock and a period from a fall to a rise of the same is each the same as a length of one cycle of said sample hold input clock, and the sample hold input clock is supplied as a driving signal of said third switch.

In another preferred construction, the digital-to-analog conversion means comprises a differential input type operation amplifier having a positive input terminal connected to said first reference voltage terminal, first and second capacitors having a predetermined capacitance and connected to a negative input terminal of said differential input type operation amplifier, first and second switches for selectively switching and supplying a gradation voltage value applied to said third reference voltage terminal or a voltage value applied to said first reference voltage terminal to second capacitor, data output switching means for selectively switching and supplying gradation voltage values applied to said second and third reference voltage terminals to the negative input terminal of said differential input type operation amplifier to selectively output said analog image data, a third switch and a second capacitor having a predetermined capacitance value connected in parallel between the output terminal and the negative input terminal of said differential input type operation amplifier, and offset voltage avoiding means connected to said first capacitor for avoiding an offset voltage of said differential input type operation amplifier, the data output switching means including, as many as the number corresponding to the number of bits of digital image data, groups each composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and the control means comprises an exclusive OR gate responsive to sample hold input clock and frame input clock for conducting logical operation, and NAND gates connected in parallel to an output end of said exclusive OR gate and as many as the number of groups of said third capacitor and said fourth and fifth switches of said switching means, the exclusive OR gate supplying output to said NAND gates, as well as branching the output into two, and after inverting the polarity of only one output, supplying the two outputs as driving signals of said first and second switches to said digital-to-analog conversion means, and the NAND gates each receiving input of its corresponding digital image data and output of said exclusive OR gate, branching the output into two, and after inverting the polarity of only one output, supplying the two outputs as driving signals of their corresponding said fourth and fifth switches of said switching means to said data output switching means of said digital-to-analog conversion means.

In the above-mentioned construction, the digital-to-analog conversion means comprises a differential input type operation amplifier having a positive input terminal connected to said first reference voltage terminal, a first capacitor having a predetermined capacitance and connected to a negative input terminal of said differential input type operation amplifier, first and second switches for selectively switching and supplying a gradation voltage value applied to said third reference voltage terminal or a voltage value applied to said first reference voltage terminal to said first capacitor, two data output switching means each correlated with a predetermined number of bits of digital image data allotted for selectively switching and supplying gradation voltage values applied to said second and third reference voltage terminals to the negative input terminal of said differential input type operation amplifier to selectively output said analog image data, and a third switch and a second capacitor having a predetermined capacitance value connected in parallel between the output terminal and the negative input terminal of said differential input type operation amplifier, the two data output switching means each including groups, as many as the number corresponding to the number of bits of its corresponding digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and the control means comprises a first exclusive OR gate responsive to sample hold input clock and frame input clock for conducting logical operation, first NAND gates connected in parallel to an output end of said exclusive OR gate and as many as the number of groups each composed of said third capacitor, and said fourth and fifth switches of one of said two switching means, second NAND gates as many as the number of groups each composed of said third capacitor, and said fourth and fifth switches of the other of said two switching means, and second exclusive OR gates each connected to each output end of said NAND gates and as many as the number of the NAND gates, the first exclusive OR gate supplying output to said NAND gates, as well as branching the output into two, and after inverting the polarity of only one of the outputs by said inverter, supplying the two outputs as driving signals of said second and third switches to said digital-to-analog conversion means, the first NAND gates each receiving input of its corresponding digital image data and output of said exclusive OR gate, branching the output into two, and after inverting the polarity of only one of the outputs by said inverter, supplying the two outputs as driving signals of its corresponding said fourth and fifth switches of said switching means to said switching means of said digital-to-analog conversion means, the second NAND gates each receiving input of its corresponding digital image data and sample hold input clock and supplying output to said second exclusive OR gates, and the second exclusive OR gates each receiving input of output of said second NAND gates and frame input clock, branching the output into two, and after inverting the polarity of only one of the outputs by said inverter, supplying the two outputs as driving signals of its corresponding said fourth and fifth switches of said switching means to said data output switching means of said digital-to-analog conversion means.

In the above-mentioned construction, the digital-to-analog conversion means comprises a differential input type operation amplifier having a positive input terminal connected to said first reference voltage terminal, first and second capacitors having a predetermined capacitance and connected to a negative input terminal of said differential input type operation amplifier, first and second switches for selectively switching and supplying a gradation voltage value applied to said third reference voltage terminal or a voltage value applied to said first reference voltage terminal to said second capacitor, data output switching means for selectively switching and supplying gradation voltage values applied to said second and third reference voltage terminals to the negative input terminal of said differential input type operation amplifier to selectively output said analog image data, and offset voltage avoiding means connected to said first capacitor for avoiding an offset voltage of said differential input type operation amplifier, and the control means comprises a first exclusive OR gate responsive to sample hold input clock and frame input clock for conducting logical operation, first NAND gates connected in parallel to an output end of said exclusive OR gate and as many as the number of groups each composed of said third capacitor, and said fourth and fifth switches of one of said two switching means, second NAND gates as many as the number of groups each composed of said third capacitor, and said fourth and fifth switches of the other of said two switching means, and second exclusive OR gates each connected to each output end of said NAND gates and as many as the number of the NAND gates, the first exclusive OR gate supplying output to said NAND gates, as well as branching the output into two, and after inverting the polarity of only one of the outputs, supplying the two outputs as driving signals of said second and third switches to said digital-to-analog conversion means, the first NAND gates each receiving input of its corresponding digital image data and output of said exclusive OR gate, branching the output into two, and after inverting the polarity of only one of the outputs, supplying the two outputs as switching signals of said data output switching means to said data output switching means of said digital-to-analog conversion means, the second NAND gates each receiving input of its corresponding digital image data and sample hold input clock and supplying output to said second exclusive OR gates, and the second exclusive OR gates each receiving input of output of said second NAND gates and frame input clock, branching the output into two, and after inverting the polarity of only one of the outputs by said inverter, supplying the two outputs as switching signals of said data output switching means to said data output switching means of said digital-to-analog conversion means.

Also, the digital-to-analog conversion means comprises a differential input type operation amplifier having a positive input terminal connected to said first reference voltage terminal, a first switch connected in parallel between the output terminal and a negative input terminal of said differential input type operation amplifier, first and second capacitors having a predetermined capacitance and connected to the negative input terminal of said differential input type operation amplifier, first and second switches for selectively switching and supplying a gradation voltage value applied to said third reference voltage terminal or a voltage value applied to said first reference voltage terminal to said second capacitor, data output switching means correlated with a predetermined number of bits of digital image data allotted for selectively switching and supplying gradation voltage values applied to said second and third reference voltage terminals to the negative input terminal of said differential input type operation amplifier to selectively output said analog image data, a third switch and a second capacitor having a predetermined capacitance value connected in parallel between the output terminal and the negative input terminal of said differential input type operation amplifier, and offset voltage avoiding means connected to said first capacitor for avoiding an offset voltage of said differential input type operation amplifier, the two data output switching means each including groups, as many as the number corresponding to the number of bits of its corresponding digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and the control means comprises a first exclusive OR gate responsive to sample hold input clock and frame input clock for conducting logical operation, first NAND gates connected in parallel to an output end of said exclusive OR gate and as many as the number of groups each composed of said third capacitor, and said fourth and fifth switches of one of said two switching means, second NAND gates as many as the number of groups each composed of said third capacitor, and said fourth and fifth switches of the other of said two switching means, and second exclusive OR gates each connected to each output end of said NAND gates and as many as the number of the NAND gates, the first exclusive OR gate supplying output to said NAND gates, as well as branching the output into two, and after inverting the polarity of only one of the outputs, supplying the two outputs as driving signals of said second and third switches to said digital-to-analog conversion means, the first NAND gates each receiving input of its corresponding digital image data and output of said exclusive OR gate, branching the output into two, and after inverting the polarity of only one of the outputs, supplying the two outputs as driving signals of its corresponding said fourth and fifth switches of said switching means to said switching means of said digital-to-analog conversion means, the second NAND gates each receiving input of its corresponding digital image data and sample hold input clock and supplying output to said second exclusive OR gates, and the second exclusive OR gates each receiving input of output of said second NAND gates and frame input clock, branching the output into two, and after inverting the polarity of only one of the outputs, supplying the two outputs as driving signals of its corresponding said fourth and fifth switches of said switching means to said data output switching means of said digital-to-analog conversion means.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENTS

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail, in order to abid unnecessarily obscuring the present invention.

Figure 1:
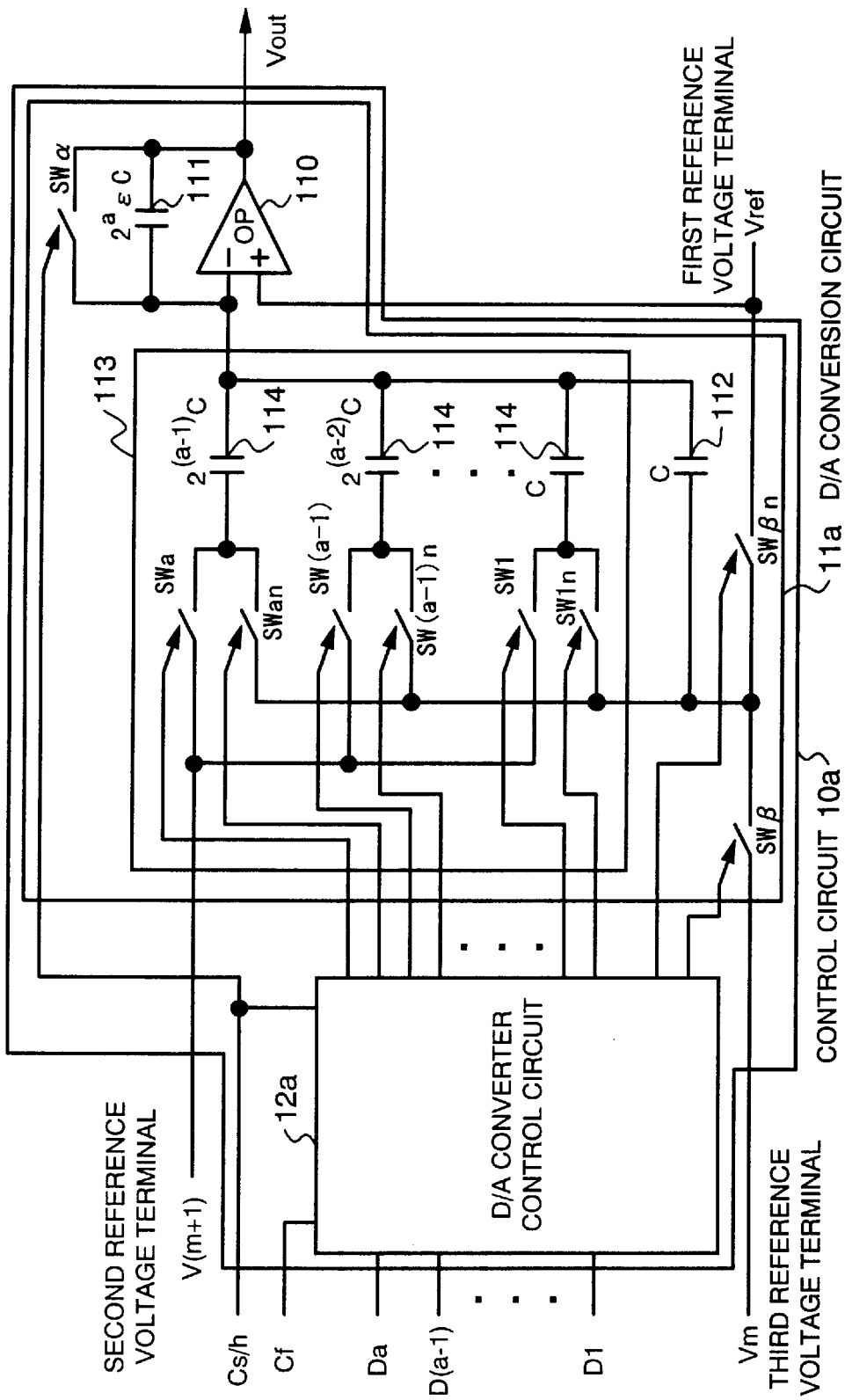
FIG. 1 is a circuit diagram showing structure of an image signal control circuit according to a first embodiment of the present invention.

FIG. 1 is a circuit diagram showing the structure of an image signal control circuit according to a first embodiment of the present invention.

As shown in FIG. 1, an image signal control circuit 10a of the present embodiment includes a D/A conversion circuit 11a and a D/A converter control circuit 12a for driving respective switches provided in the D/A conversion circuit 11a. In FIG. 1, illustration is made only of the characteristic part of the structure of the present embodiment and that of the remaining common part is omitted.

The D/A conversion circuit 11a includes a differential input type operation amplifier 110, a first switch SW α and a capacitor 111 denoted by a capacitance value $2^1 \epsilon C$ connected in parallel between an output terminal and a negative input terminal of the differential input type operation amplifier 110, a capacitor 112 with the capacitance value C and a number a of capacitors 114 including $2^0$ C, $2^1 C$, ~, $2^{a-2}C$ and $2^{a-1}C$ (C denotes a unit capacitance value) connected in parallel to the negative input terminal of the differential input type operation amplifier 110, and a group of switches for supplying a predetermined reference voltage to each capacitor. Here, $\epsilon$ of the capacitance value $2^a \epsilon C$ of the capacitor 111 denotes a variable which specifies an amplification degree (gain) of the D/A conversion circuit and to which an arbitrary positive numerical is allotted. In the present embodiment, $\epsilon$ is set to be 1. In addition, the value of "a" is determined according to the number of bits of digital image data.

A positive input terminal of the differential input type operation amplifier 110 is connected to a first reference voltage terminal Vref. The others of the respective ends of a number a of the capacitors 114 including $2^0C$, $2^1C$, ~, $2^{a-2}C$ and $2^{a-1}C$ are connected to ones of the respective ends of a number a of switch groups in which switches SW1-Swa and SW1n-SWan are paired respectively. That is, a data output switching means 113 is formed by a number a of groups each of which is composed of the switch SW, the switch SWn and the capacitor 114. The others of the respective ends of the switches SW1-SWa are connected to a second reference voltage terminal V(m+1). The others of the respective ends of the switches SW1n-SWan are connected to a third reference voltage terminal Vm through a switch SW β as well as to the first reference voltage terminal Vref through a switch SW βn. The capacitor 112 with the capacitance value C is also connected to the third reference voltage terminal Vm through the switch SW β as well as to the first reference voltage terminal Vref through the switch SW βn.

Figure 2:
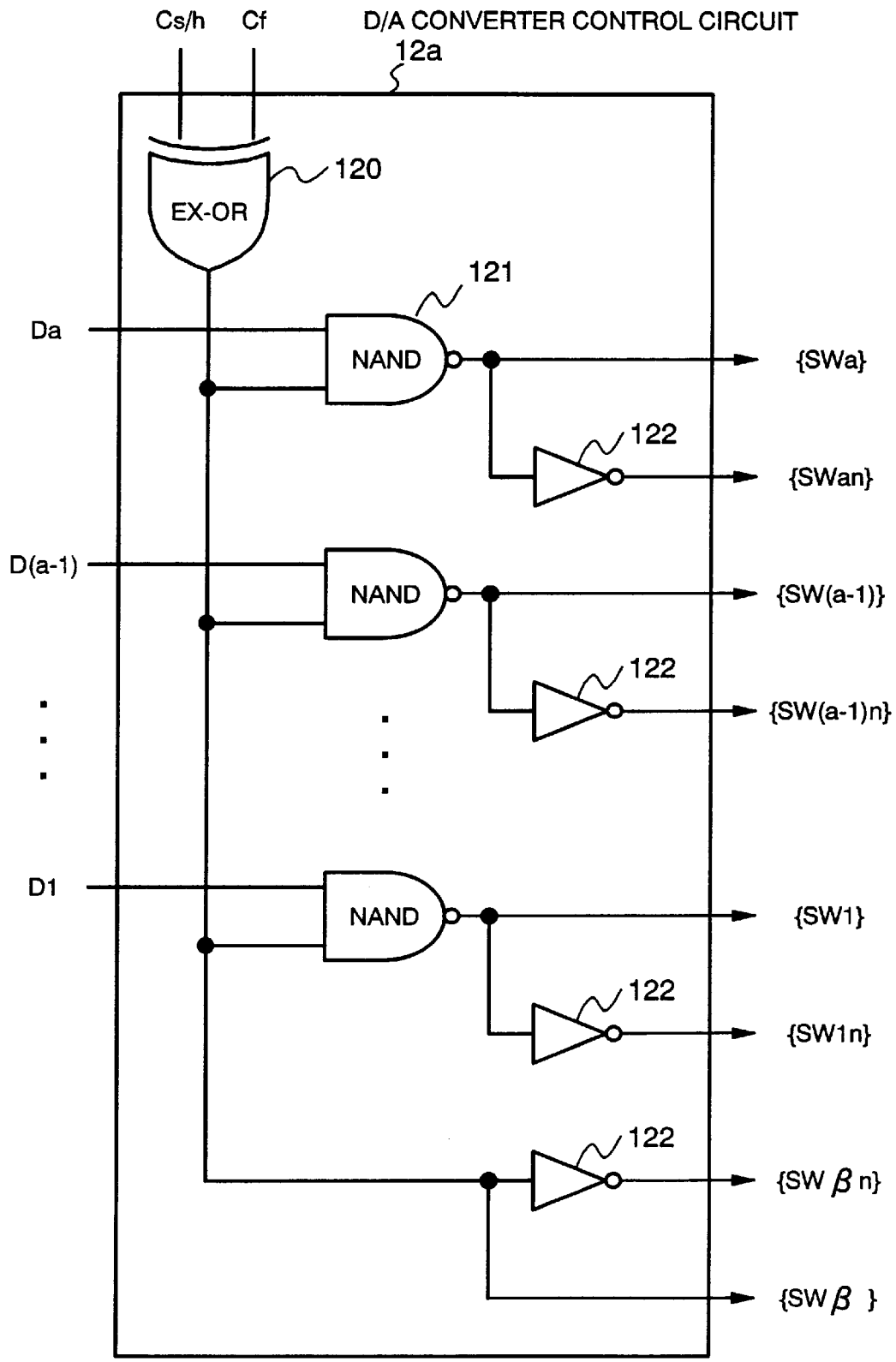
FIG. 2 is a circuit diagram showing structure of a D/A converter control circuit according to the first embodiment.

FIG. 2 shows the structure of a D/A converter control circuit 12a. As illustrated in the figure, the D/A converter control circuit 12a includes an exclusive OR gate 120, a number a of NAND gates 121 connected in parallel to an output end of the exclusive OR gate 120, and inverters 122 for inverting the polarity of output of the NAND gates 121.

Applied to the D/A converter control circuit 12a are a-bit digital image data D1-Da, sample hold input clock Cs/h and frame input clock Cf. The sample hold input clock Cs/h and the frame input clock Cf are applied to the respective input ends of the exclusive OR gate 120. Each of the digital image data D1-Da is applied to its corresponding NAND gate 121 together with the output of the exclusive OR gate 120. Each output of the NAND gates 121 is branched into two, one of which is applied to its corresponding one of the switches SW1-SWa to drive the same. The other output is inverted by the inverter 122 and then applied to its corresponding one of the switches SW1n-SWan to drive the same. The output of the exclusive OR gate 120 is not only supplied to each NAND gate 121 but also branched into two, one of which is supplied to the switch SW β and the other of which is inverted by the inverter 122 and then supplied to the switch SW βn to drive the same.

The sample hold input clock Cs/h is also supplied to the first switch SW a to drive the same.

Figure 3:
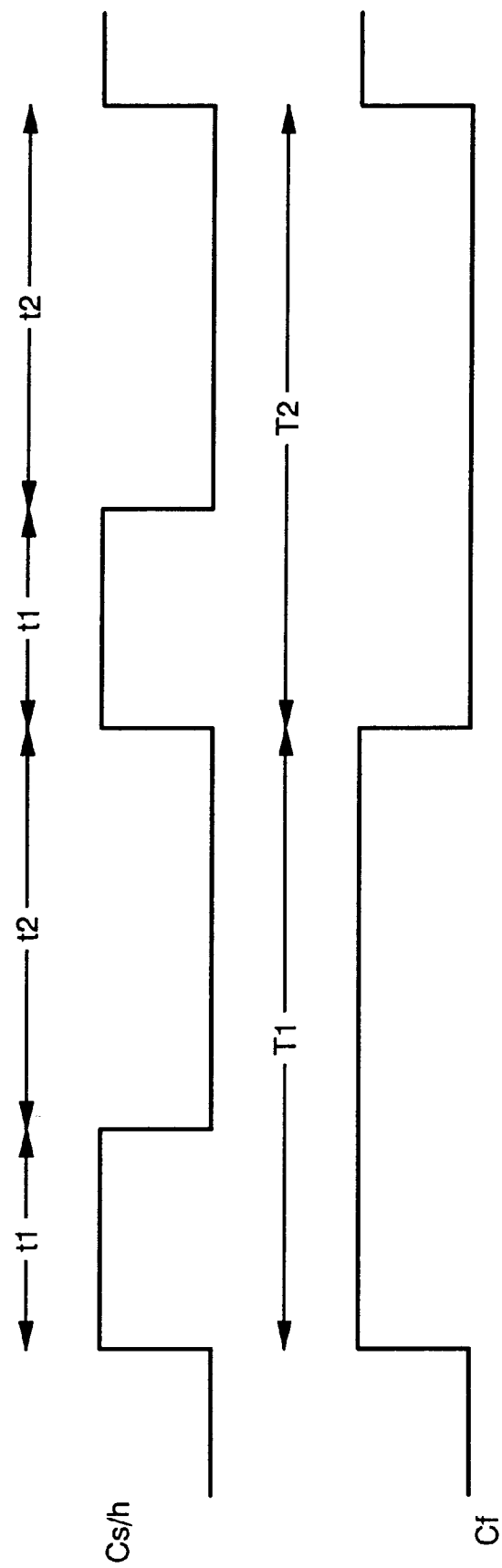
FIG. 3 is a timing chart for use in explaining operation of the first embodiment.

FIG. 3 is a timing chart showing the clock Cs/h and the clock Cf in one horizontal synchronization period at thus structured image signal control device 10. In the period T1 shown in FIG. 3, when the clock Cs/h and the clock Cf are applied to the D/A converter control circuit 12a and the digital image data D1-Da is also applied to the same, the D/A conversion circuit 11a of FIG. 1 starts operation at the shift from the period t1 to the period t2 of the period T1. The operation result at this time, that is, the output voltage Vout of the D/A conversion circuit 11a takes a value expressed by the following equation (1), where the value of x represents a value obtained by the conversion of digital image data to decimal notation and the value is within the range of $0 \leq x < 2^a$.

$$Vout = 2Vref - Vm - (x/2^a)\{V(m+1) - Vm\} \quad (1)$$

The output voltage Vout of the D/A conversion circuit 11a in the period T2 takes a value expressed by the following equation (2).

$$Vout = Vm + (x/2^a)\{V(m+1) - Vm\} \quad (2)$$

Here, comparison between the equations (1) and (2) will find the value of the output voltage Vout having the polarity opposite to that of the reference voltage Vref. With the same digital image data, therefore, an output whose polarity is opposite to that of the reference voltage Vref can be obtained by switching a signal to be applied to the frame input clock Cf to the "H" level or the "L" level. This enables the present embodiment to have an output of reverse polarity only by changing sampling timing of digital image data without inverting the polarities of the reference voltage terminals V(m+1) and Vm.

Figure 4:
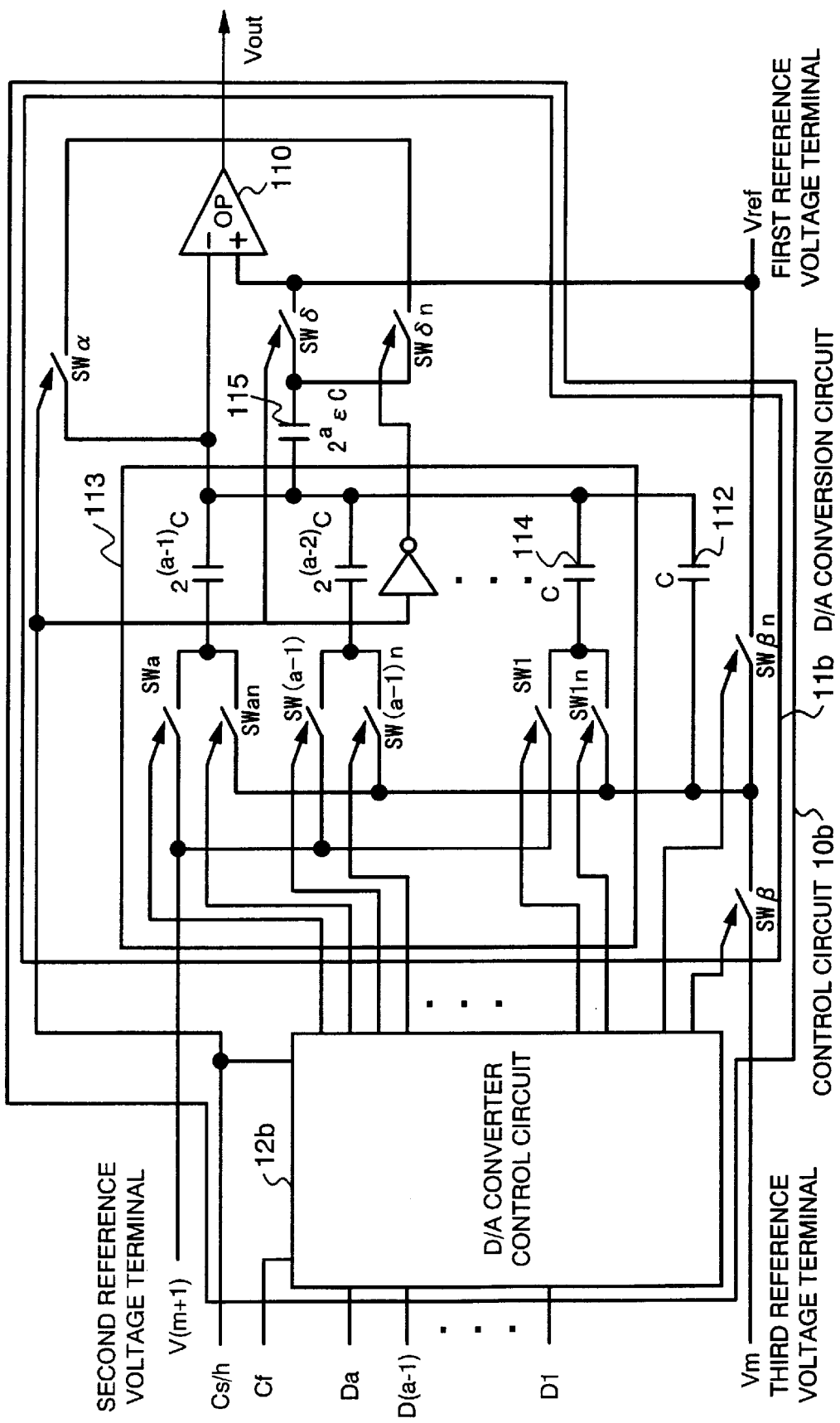
FIG. 4 is a circuit diagram showing structure of an image signal control circuit according to a second embodiment of the present invention.

FIG. 4 is a circuit diagram showing structure of an image signal control circuit according to a second embodiment of the present invention.

As illustrated in FIG. 4, an image signal control circuit 10b of the present embodiment includes a D/A conversion circuit 11b and a D/A converter control circuit 12b for driving respective switches provided at the D/A conversion circuit 11b. In FIG. 4, illustration is made only of a characteristic part of the present embodiment and that of the remaining common part is omitted.

The D/A conversion circuit 11b, which has approximately the same structure as that of the D/A conversion circuit 11a of the first embodiment shown in FIG. 1, includes a differential input type operation amplifier 110, a first switch SW a and α capacitor 111 with a capacitance value of $2^a$ ε connected between an output terminal and a negative input terminal of the differential input type operation amplifier 110, a capacitor 112 and a number a of capacitors 114 connected in parallel to the negative input terminal of the differential input type operation amplifier 110, and a group of switches for supplying a predetermined reference voltage to each capacitor.

One end of the capacitor 111 with the capacitance value of $2^a$ ε is directly connected to the negative input terminal of the differential input type operation amplifier 110 and the other end is branched into two which are connected to paired switches, a switch SW δ and a switch SW δn. One of the branches is then connected to a reference voltage terminal Vref through the switch SW δ and the other is connected to the output terminal of the differential input type operation amplifier 110 through the switch SW δn.

The D/A converter control circuit 12b has the same structure as that of the D/A converter control circuit 12a of the first embodiment shown in FIG. 1.

Sample hold input clock Cs/h is supplied to the first switch SW α, the switch SW δ, and the switch SW δn through the inverter to drive the respective switches.

Although basic operation of thus structured second embodiment is the same as that of the above-described first embodiment, addition of the paired switches SW δ and SW δn enables the second embodiment to cancel an offset voltage to reduce an output error at the D/A conversion circuit, thereby achieving an output with high precision to realize a multi-output liquid crystal image driving circuit with small deviation of an output voltage.

Figure 5:
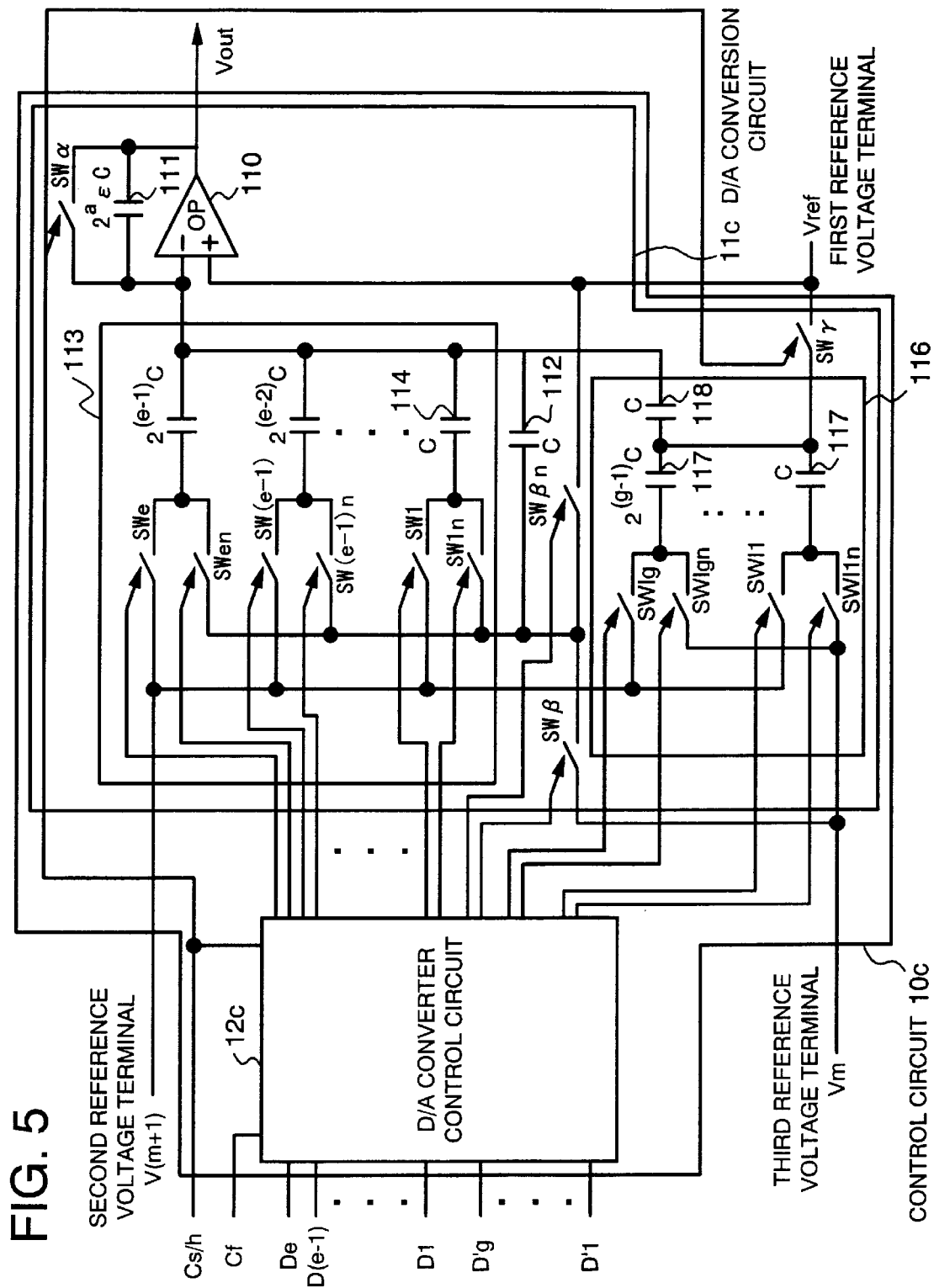
FIG. 5 is a circuit diagram showing structure of an image signal control circuit according to a third embodiment of the present invention.

FIG. 5 is a circuit diagram showing structure of an image signal control circuit according to a third embodiment of the present invention.

As illustrated in FIG. 5, an image signal control circuit 10c of the present embodiment includes a D/A conversion circuit 11c and a D/A converter control circuit 12c for driving respective switches provided at the D/A conversion circuit 11c. In FIG. 5, illustration is made only of a characteristic part of the present embodiment and that of the remaining common part is omitted.

The D/A conversion circuit 11c includes a differential input type operation amplifier 110, a first switch SW α and a capacitor 111 denoted by a capacitance value of $2^a$ ε connected in parallel between an output terminal and a negative input terminal of the differential input type operation amplifier 110, a capacitor 112 with a capacitance value of C and a number e of capacitors 114 including $2^0C$, $2^1C$, ~, $2^{e-2}C$, and $2^{e-1}C$ (C denotes a unit capacitance value) connected parallel to the negative input terminal of the differential input type operation amplifier 110, a number g of capacitors 117 including $2^0C$, $2^1C$, ~, $2^{g-2}C$, and $2^{g-1}C$ connected in parallel to the negative input terminal of the differential input type operation amplifier 110 through a capacitor 118 with the capacitance value C, and switch groups for supplying each capacitor with a predetermined reference voltage. It is also assumed in the present embodiment that $\epsilon=1$. In addition, the values of "e" and "g" will be determined according to the number of bits of digital image data.

A positive input terminal of the differential input type operation amplifier 110 is connected to a first reference voltage terminal Vref. The others of the respective ends of a number e of the capacitors 114 including $2^0C$, $2^1C$, ~, $2^{e-2}C$, and $2^{e-1}C$ are connected to ones of the respective ends of a number e of switch groups in which switches SW1-SWe and switches SW1n-SWen are paired respectively. That is, a data output switching means 113 is formed by a number e of groups each of which is composed of the switch SW, the switch SWn and the capacitor 114. The others of the respective ends of the switches SW1-SWe are connected to a second reference voltage terminal V(m+1). The others of the respective ends of the switches SW1n-SWen are connected to a third reference voltage terminal Vm through a switch SW β as well as to the first reference voltage terminal Vref through a switch SW βn. The capacitor 112 with the capacitance value C is also connected to the third reference voltage terminal Vm through the switch SW β as well as to the first reference voltage terminal Vref through the switch SW βn.

The others of the respective ends of a number g of the capacitors 117 including $2^0C$, $2^1C$, ~, $2^{-2}C$, and $2^{g-1}C$ which are connected to the negative input terminal of the differential input type operation amplifier 110 through the capacitor 118 with the capacitance value C are connected to ones of the respective ends of a number g of switch groups in which switches SWI1-SWIg and switches SWI1n-SWIgn are paired respectively. That is, a data output switching means 116 is formed by a number g of groups each of which is composed of the switch SWI, the switch SWIn and the capacitor 114. The others of the respective ends of the switches SWI1-SWIg are connected to the second reference voltage terminal V(m+1). The others of the respective ends of the switches SWI1n-SWIen are connected to the third reference voltage terminal Vm. In addition, the connection ends of a number g of the capacitors with the above-described capacitor 118 having the capacitance value C are connected to the first reference voltage terminal Vref through a switch SW γ.

Sample hold input clock Cs/h is also supplied to the first switch SW α to drive the same.

Figure 6:
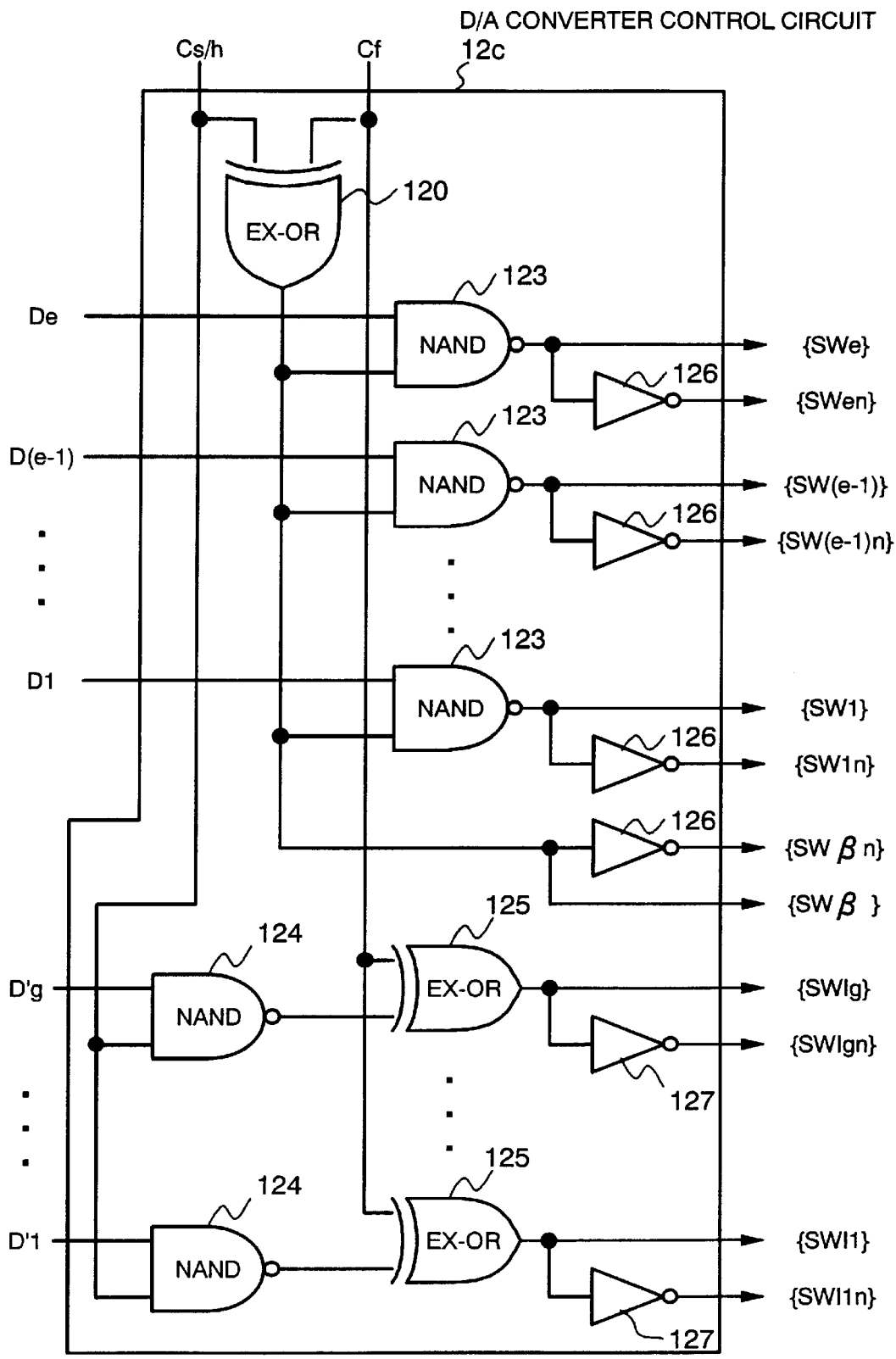
FIG. 6 is a circuit diagram showing structure of a D/A converter control circuit of the second embodiment.

FIG. 6 shows structure of the D/A converter control circuit 12c. As illustrated in the figure, the D/A converter control circuit 12c includes an exclusive OR gate 120, a number e of NAND gates 123 connected in parallel to an output end of the exclusive OR gate 120, a number g of NAND gates 124 provided in parallel, a number g of exclusive OR gates 125 each connected to an output end of each of the NAND gates 124, an inverter 126 for inverting the polarity of outputs of the NAND gates 123, and an inverter 127 for inverting the polarity of outputs of the exclusive OR gates 125.

Applied to the D/A converter control circuit 12c are (e+g)-bit digital image data D1-De, D'1-D'g, sample hold input clock Cs/h and frame input clock Cf. The sample hold input clock Cs/h is branched and applied to the exclusive OR gate 120 and a number g of the NAND gates 124. The frame input clock Cf is branched and applied to the exclusive OR gate 120 and a number g of exclusive OR gates 125.

The digital image data D1-De is applied to its corresponding NAND gate 123 together with the output of the exclusive OR gate 120. The output of the NAND gate 123 is branched into two, one of which is supplied to its corresponding one of switches SW1-SWe to drive the same. The other is inverted by the inverter 126 and then supplied to its corresponding one of switches SW1n-SWen to drive the same. The output of the exclusive OR gate 120 is not only supplied to each NAND gate 123 but also branched into two, one of which is supplied to a switch SW β and the other of which is inverted by the inverter 126 and then supplied to a switch SW n to drive the same.

The digital image data D'1-D'g is applied, together with the sample hold input clock Cs/h, to a number g of the NAND gates 124. Each output of the NAND gates 124 is applied to its corresponding exclusive OR gate 125 together with the frame input clock Cf. Each output of the exclusive OR gates 125 is branched into two, one of which is supplied to its corresponding one of switches SWI1-SWIg to drive the same. The other is inverted by the inverter 127 and supplied to its corresponding one of switches SWI1n-SWIgn to drive the same.

Operation of the present embodiment is the same as that of the first embodiment and the timing chart showing the clock Cs/h and the clock Cf in one horizontal synchronization period is the same as that shown in FIG. 3. With reference to FIG. 3, when in the period T1, the clock Cs/h and the clock Cf are applied to the D/A converter control circuit 12c and the digital image data D1-De and D'1-D'g is also applied to the same, the D/A conversion circuit 11c starts operation at the shift from the period t1 to the period t2 of the period T1. Operation result obtained at this time, that is, the output voltage Vout of the D/A conversion circuit 11c takes a value expressed by the following equation (3), where the values of x and y represent values obtained by the conversion of digital image data to decimal notation and the values are within the range of $0 \leq x < 2^e$, $0 \leq y < 2^g$.

$$Vout = 2Vref - Vm - (x/2^e)\{V(m+1) - Vm\} - (y/2^{(e+g)})\{V(m+1) - Vm\} \quad (3)$$

Next, the output voltage Vout of the D/A conversion circuit 11c in the period T2 takes a value expressed by the following equation (4).

$$Vout = Vm + (x/2^e)\{V(m+1) - Vm\} + (Y/2^{(e+g)})\{V(m+1) - Vm\} \quad (4)$$

Here, comparison between the equations (3) and (4) will find that the value of the output voltage Vout has the polarity opposite to that of the reference voltage Vref. With the same digital image data, therefore, an output whose polarity is opposite to that of the reference voltage Vref can be obtained by switching a signal to be applied to the frame input clock Cf to the "H" level or the "L" level. This enables the present embodiment to have an output of reverse polarity only by changing sampling timing of digital image data without inverting the polarities of the reference voltage terminals V(m+1) and Vm.

As compared with the above-described first and second embodiments, the present embodiment enables drastic reduction of a necessary number of capacitors to reduce a circuit scale through D/A conversion of digital image data which is divided into higher-order bits and lower-order bits.

Figure 7:
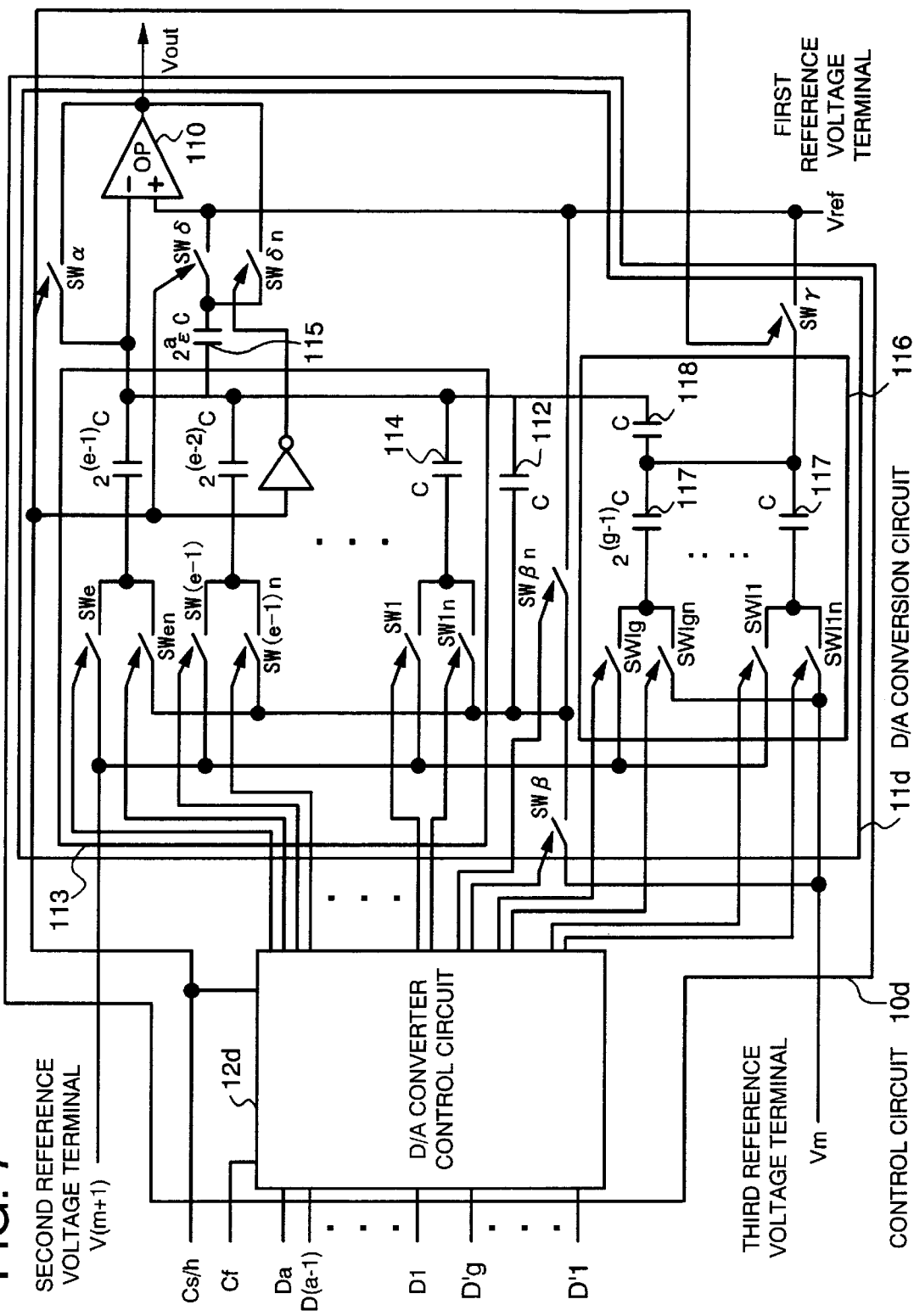
FIG. 7 is a circuit diagram showing structure of an image signal control circuit according to a fourth embodiment of the present invention.

FIG. 7 is a circuit diagram showing structure of an image signal control circuit according to a fourth embodiment of the present invention.

As illustrated in FIG. 7, an image signal control circuit 10d of the present embodiment includes a D/A conversion circuit 11d and a D/A converter control circuit 12d for driving respective switches provided at the D/A conversion circuit 11d. In FIG. 7, illustration is made only of a characteristic part of the present embodiment and that of the remaining common part is omitted.

The D/A conversion circuit 11d, which has approximately the same structure as that of the D/A conversion circuit 11c of the third embodiment shown in FIG. 5, includes a differential input type operation amplifier 110, a first switch SW α and a capacitor 111 with a capacitance value $2^a \epsilon C$ connected between an output terminal and a negative input terminal of the differential input type operation amplifier 110, a capacitor 112 and a number e of capacitors 114 connected in parallel to the negative input terminal of the differential input type operation amplifier 110, a number g of capacitors 117 whose capacitance values are $2^0 C$, $2^1 C$, ~, $2^{g-2}C$, and $2^{g-1}C$ connected in parallel to the negative input terminal of the differential input type operation amplifier 110 through a capacitor 118 with a capacitance value C, and switch groups for supplying each capacitor with a predetermined reference voltage.

The difference is that one end of the capacitor 111 with the capacitance value $2^a \epsilon C$ is directly connected to the negative input terminal of the differential input type operation amplifier 110 and the other end is branched into two which are connected to paired switches of switches SW δ and SW δn. Then, one of the branches is connected to a reference voltage terminal Vref through the switch SW δ and the other is connected to the output terminal of the differential input type operation amplifier 110 through the switch SW δn.

The D/A converter control circuit 12d is similarly structured to the D/A converter control circuit 12c of the third embodiment shown in FIG. 5.

Sample hold input clock Cs/h is supplied to the first switch SW α, the switch SW δ, and the switch SW δn through the inverter to drive the same.

Although basic operation of thus structured fourth embodiment is the same as that of the above-described third embodiment, addition of the paired switches SW δ and SW δn allows the fourth embodiment to cancel an offset voltage to reduce an output error at the D/A conversion circuit. As a result, it is possible to obtain an output with high precision to realize a multi-output liquid crystal image driving circuit with small deviation of an output voltage.

Figure 8:
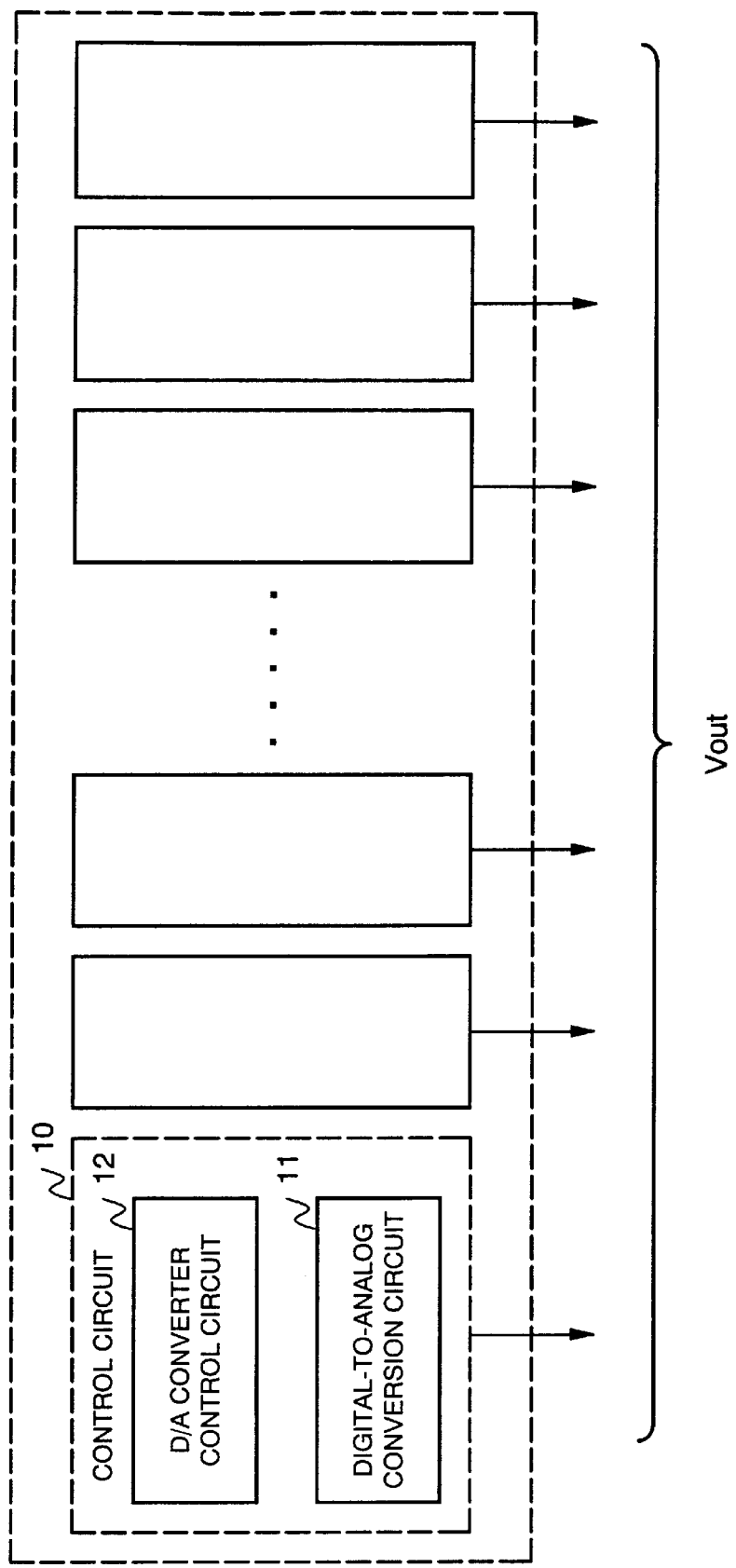
FIG. 8 is a block diagram showing structure of a liquid crystal image driving circuit as a multi-output LSI including a plurality of the image signal control circuits of the present invention.
Figure 9:
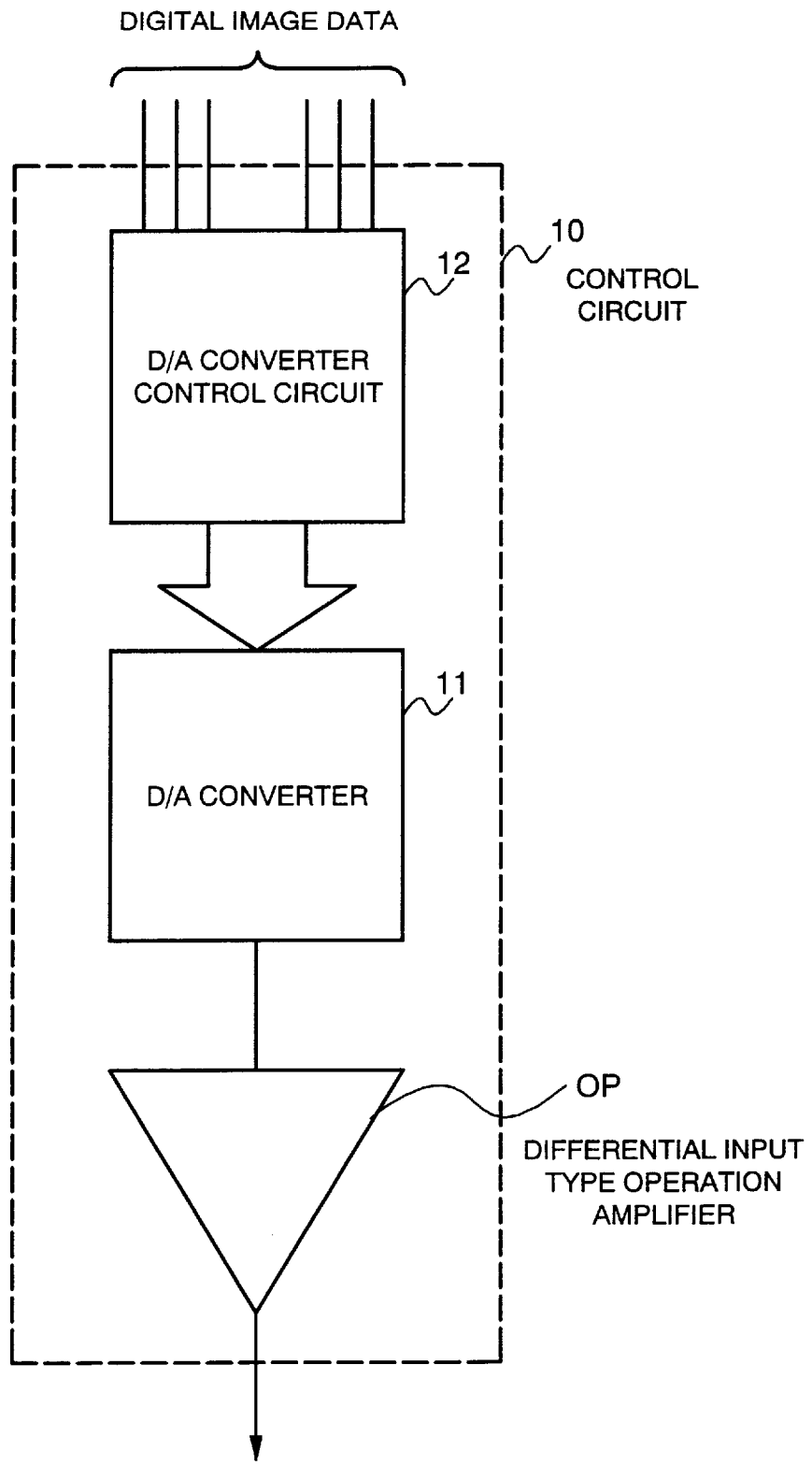
FIG. 9 is a block diagram schematically showing structure of the image signal control circuit of the present invention.
Figure 10:
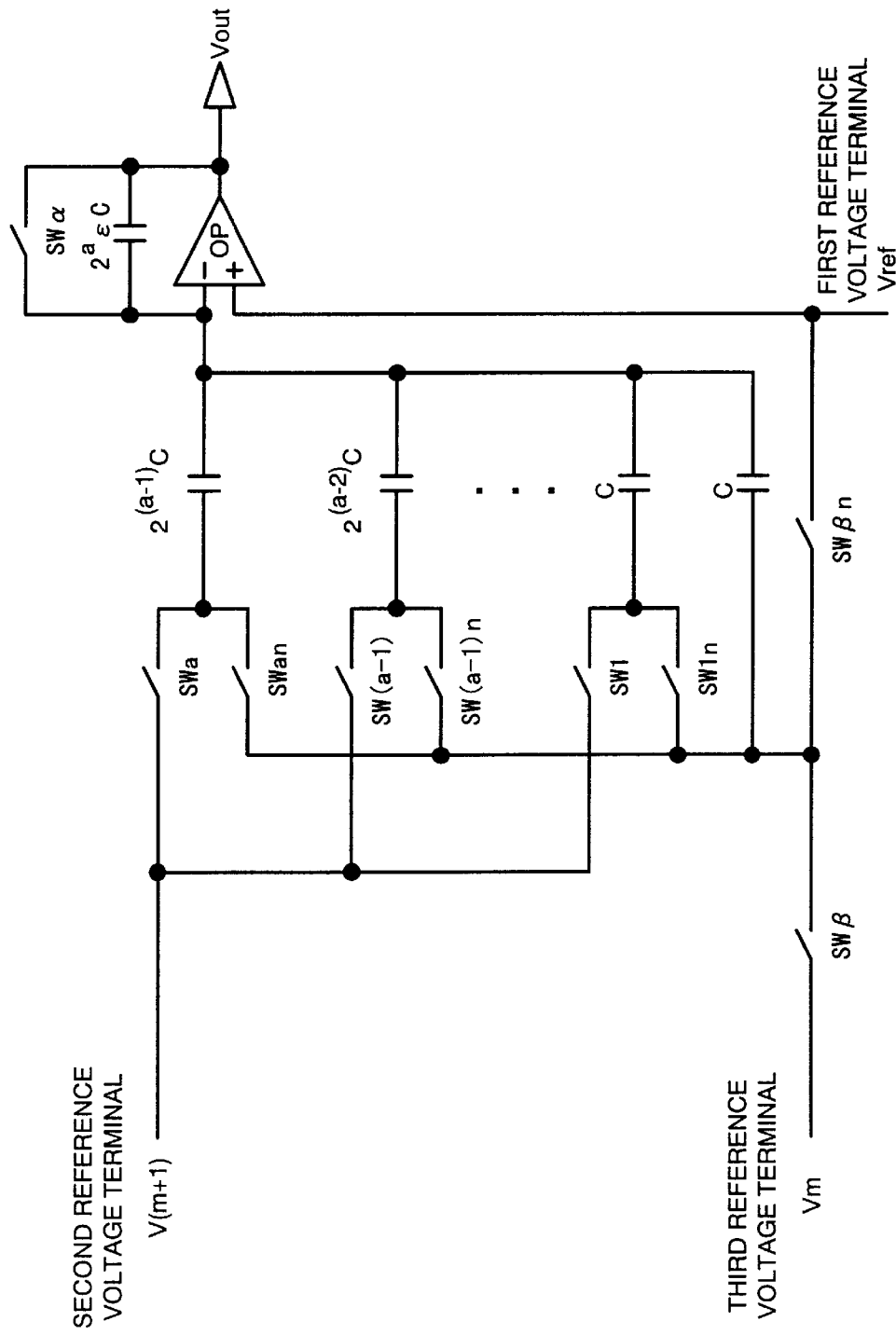
FIG. 10 is a circuit diagram showing structure of a conventional D/A conversion circuit.

FIG. 8 is a block diagram showing structure of a liquid crystal image driving circuit as a multi-output LSI including a plurality of the image signal control circuits 10 of the present invention which have been described with respect to the foregoing respective embodiments. FIG. 9 is a block diagram schematically showing structure of the image signal control circuit 10 of the present invention.

As has been described in the foregoing, the image signal control circuit of the present invention generates a voltage of different polarity at a predetermined reference voltage terminal and switchedly outputs an output signal of the polarity at every frame period by changing a digital image data sampling method. This makes it possible to have an output of reverse polarity at the first reference voltage terminal without arrangement for inverting the polarities of gradation voltage values at the second and the third reference voltage terminals. As a result, it is possible to reduce the size of a liquid crystal driving system to cut down power consumption.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An image signal control circuit for converting digital image data into analog image data and sending the data to source driving means for driving a source line of a multi-gradation liquid crystal display, comprising:

digital-to-analog conversion means having a first reference voltage terminal to be supplied with a predetermined voltage value and second and third reference voltage terminals to be supplied with a gradation voltage value for the voltage value applied to the first reference voltage terminal for outputting, as analog image data, one value of gradated analog gradation data obtained by the division of the gradation voltage, and control means for receiving input of digital image data, sample hold input clock and frame input clock, wherein said control means is operative to switch the polarity of said analog image data output from said digital-to-analog conversion means at every frame period by controlling said digital-to-analog conversion means based on the values of said digital image data said sample hold input clock and said frame input clock.

2. The image signal control circuit as set forth in claim 1, wherein said digital-to-analog conversion means comprises:

a differential input type operation amplifier having a positive input terminal connected to said first reference voltage terminal, a first capacitor having a predetermined capacitance and connected to a negative input terminal of said differential input type operation amplifier, first and second switches for selectively switching and supplying a gradation voltage value applied to said third reference voltage terminal or a voltage value applied to said first reference voltage terminal to said first capacitor, and data output switching means for selectively switching and supplying gradation voltage values applied to said second and third reference voltage terminals to the negative input terminal of said differential input type operation amplifier to selectively output said analog image data, and said control means comprises:

an exclusive OR gate responsive to sample hold input clock and frame input clock for conducting logical operation, and NAND gates connected in parallel to an output end of said exclusive OR gate as many as the number corresponding to the number of bits of digital image data, said exclusive OR gate supplying output to said NAND gates, as well as branching the output into two, and after inverting the polarity of only one output, supplying the two outputs as driving signals of said first and second switches to said digital-to-analog conversion means, and said NAND gates each receiving input of its corresponding digital image data and output of said exclusive OR gate, branching the output into two, and after inverting the polarity of only one output, supplying the two outputs as switching signals of said data output switching means to said data output switching means of said digital-to-analog conversion means.

3. The image signal control circuit as set forth in claim 1, wherein said digital-to-analog conversion means comprises:
a differential input type operation amplifier having a positive input terminal connected to said first reference voltage terminal,
a first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor,
data output switching means for selectively switching and supplying gradation voltage values applied to said second and third reference voltage terminals to the negative input terminal of said differential input type operation amplifier to selectively output said analog image data, and
a third switch and a second capacitor having a predetermined capacitance value connected in parallel between the output terminal and the negative input terminal of said differential input type operation amplifier,
said data output switching means including groups, as many as the number corresponding to the number of bits of digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and said control means comprises:
an exclusive OR gate responsive to sample hold input clock and frame input clock for conducting logical operation, and
NAND gates connected in parallel to an output end of said exclusive OR gate and as many as the number of groups of said third capacitor and said fourth and fifth switches of said switching means,
said exclusive OR gate supplying output to said NAND gates, as well as branching the output into two, and after inverting the polarity of only one output, supplying the two outputs as driving signals of said first and second switches to said digital-to-analog conversion means, and
said NAND gates each receiving input of its corresponding digital image data and output of said exclusive OR gate, branching the output into two, and after inverting the polarity of only one output, supplying the two outputs as driving signals of their corresponding said fourth and fifth switches of said switching means to said data output switching means of said digital-to-analog conversion means.

4. The image signal control circuit as set forth in claim 2, wherein a length of a period from a rise to a fall of said frame input clock and a period from a fall to a rise of the same is each the same as a length of one cycle of said sample hold input clock.

5. The image signal control circuit as set forth in claim 3, wherein a length of a period from a rise to a fall of said frame input clock and a period from a fall to a rise of the same is each the same as a length of one cycle of said sample hold input clock, and said sample hold input clock is supplied as a driving signal of said third switch.

6. The image signal control circuit as set forth in claim 1, wherein said digital-to-analog conversion means comprises:
a differential input type operation amplifier having a positive input terminal connected to said first reference voltage terminal,
first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor,
data output switching means for selectively switching and supplying gradation voltage values applied to said second and third reference voltage terminals to the negative input terminal of said differential input type operation amplifier to selectively output said analog image data, and
offset voltage avoiding means connected to said first capacitor for avoiding an offset voltage of said differential input type operation amplifier, and said control means comprises:
an exclusive OR gate responsive to sample hold input clock and frame input clock for conducting logical operation, and
NAND gates connected in parallel to an output end of said exclusive OR gate as many as the number corresponding to the number of bits of digital image data,
said exclusive OR gate supplying output to said NAND gates, as well as branching the output into two, and after inverting the polarity of only one output, supplying the two outputs as driving signals of said first and second switches to said digital-to-analog conversion means, and
said NAND gates each receiving input of its corresponding digital image data and output of said exclusive OR gate, branching the output into two, and after inverting the polarity of only one output, supplying the two outputs as switching signals of said data output switching means to said data output switching means of said digital-to-analog conversion means.

7. The image signal control circuit as set forth in claim 1, wherein
said digital-to-analog conversion means comprises:
a differential input type operation amplifier having a positive input terminal connected to said first reference voltage terminal,
first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor,
data output switching means for selectively switching and supplying gradation voltage values applied to said second and third reference voltage terminals to the negative input terminal of said differential input type operation amplifier to selectively output said analog image data,
a third switch and a second capacitor having a predetermined capacitance value connected in parallel between the output terminal and the negative input terminal of said differential input type operation amplifier, and
offset voltage avoiding means connected to said first capacitor for avoiding an offset voltage of said differential input type operation amplifier,
said data output switching means including, as many as the number corresponding to the number of bits of digital image data, groups each composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and
said control means comprises:
an exclusive OR gate responsive to sample hold input clock and frame input clock for conducting logical operation, and
NAND gates connected in parallel to an output end of said exclusive OR gate and as many as the number of groups of said third capacitor and said fourth and fifth switches of said switching means,
said exclusive OR gate supplying output to said NAND gates, as well as branching the output into two, and after inverting the polarity of only one output, supplying the two outputs as driving signals of said first and second switches to said digital-to-analog conversion means, and
said NAND gates each receiving input of its corresponding digital image data and output of said exclusive OR gate, branching the output into two, and after inverting the polarity of only one output, supplying the two outputs as driving signals of their corresponding said fourth and fifth switches of said switching means to said data output switching means of said digital-to-analog conversion means.

8. The image signal control circuit as set forth in claim 6, wherein a length of a period from a rise to a fall of said frame input clock and a period from a fall to a rise of the same is each the same as a length of one cycle of said sample hold input clock.

9. The image signal control circuit as set forth in claim 7, wherein
a length of a period from a rise to a fall of said frame input clock and a period from a fall to a rise of the same is each the same as a length of one cycle of said sample hold input clock, and
said sample hold input clock is supplied as driving signals of said third switch and said offset voltage avoiding means.

10. The image signal control circuit as set forth in claim 1, wherein
said digital-to-analog conversion means comprises:
a differential input type operation amplifier having a positive input terminal connected to said first reference voltage terminal,
a first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor, and
two data output switching means each correlated with a predetermined number of bits of digital image data allotted for selectively switching and supplying gradation voltage values applied to said second and third reference voltage terminals to the negative input terminal of said differential input type operation amplifier to selectively output said analog image data, and
said control means comprises:
a first exclusive OR gate responsive to sample hold input clock and frame input clock for conducting logical operation,
first NAND gates connected in parallel to an output end of said exclusive OR gate and as many as the number of groups each composed of said third capacitor, and said fourth and fifth switches of one of said data output switching means,
second NAND gates as many as the number of groups each composed of said third capacitor, and said fourth and fifth switches of the other of said data output switching means, and
second exclusive OR gates each connected to each output end of said NAND gates and as many as the number of the NAND gates,
said first exclusive OR gate supplying output to said NAND gates, as well as branching the output into two, and after inverting the polarity of only one of the outputs, supplying the two outputs as driving signals of said first and second switches to said digital-to-analog conversion means,
said first NAND gates each receiving input of its corresponding digital image data and output of said exclusive OR gate, branching the output into two, and after inverting the polarity of only one of the outputs, supplying the two outputs as switching signals of said data output switching means to said data output switching means of said digital-to-analog conversion means,
said second NAND gates each receiving input of its corresponding digital image data and sample hold input clock and supplying output to said second exclusive OR gates, and
said second exclusive OR gates each receiving input of output of said second NAND gates and frame input clock, branching the output into two, and after inverting the polarity of only one of the outputs, supplying the two outputs as switching signals of said data output switching means to said data output switching means of said digital-to-analog conversion means.

11. The image signal control circuit as set forth in claim 1, wherein said digital-to-analog conversion means comprises:
a differential input type operation amplifier having a positive input terminal connected to said first reference voltage terminal,
a first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor,
two data output switching means each correlated with a predetermined number of bits of digital image data allotted for selectively switching and supplying gradation voltage values applied to said second and third reference voltage terminals to the negative input terminal of said differential input type operation amplifier to selectively output said analog image data, and
a third switch and a second capacitor having a predetermined capacitance value connected in parallel between the output terminal and the negative input terminal of said differential input type operation amplifier,
said two data output switching means each including groups, as many as the number corresponding to the number of bits of its corresponding digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and said control means comprises:
a first exclusive OR gate responsive to sample hold input clock and frame input clock for conducting logical operation,
first NAND gates connected in parallel to an output end of said exclusive OR gate and as many as the number of groups each composed of said third capacitor, and said fourth and fifth switches of one of said two switching means,
second NAND gates as many as the number of groups each composed of said third capacitor, and said fourth and fifth switches of the other of said two switching means, and
second exclusive OR gates each connected to each output end of said NAND gates and as many as the number of the NAND gates,
said first exclusive OR gate supplying output to said NAND gates, as well as branching the output into two, and after inverting the polarity of only one of the outputs by said inverter, supplying the two outputs as driving signals of said second and third switches to said digital-to-analog conversion means,
said first NAND gates each receiving input of its corresponding digital image data and output of said exclusive OR gate, branching the output into two, and after inverting the polarity of only one of the outputs by said inverter, supplying the two outputs as driving signals of its corresponding said fourth and fifth switches of said switching means to said switching means of said digital-to-analog conversion means,
said second NAND gates each receiving input of its corresponding digital image data and sample hold input clock and supplying output to said second exclusive OR gates, and
said second exclusive OR gates each receiving input of output of said second NAND gates and frame input clock, branching the output into two, and after inverting the polarity of only one of the outputs by said inverter, supplying the two outputs as driving signals of its corresponding said fourth and fifth switches of said switching means to said data output switching means of said digital-to-analog conversion means.

12. The image signal control circuit as set forth in claim 10, wherein a length of a period from a rise to a fall of said frame input clock and a period from a fall to a rise of the same is each the same as a length of one cycle of said sample hold input clock.

13. The image signal control circuit as set forth in claim 11, wherein a length of a period from a rise to a fall of said frame input clock and a period from a fall to a rise of the same is each the same as a length of one cycle of said sample hold input clock, and
said sample hold input clock is supplied as a driving signal of said third switch.

14. The image signal control circuit as set forth in claim 1, wherein said digital-to-analog conversion means comprises:
a differential input type operation amplifier having a positive input terminal connected to said first reference voltage terminal,
first capacitor having a predetermined capacitance and connected to a negative input terminal of said differential input type operation amplifier,
first and second switches for selectively switching and supplying a gradation voltage value applied to said third reference voltage terminal or a voltage value applied to said first reference voltage terminal to said first capacitor,
data output switching means for selectively switching and supplying gradation voltage values applied to said second and third reference voltage terminals to the negative input terminal of said differential input type operation amplifier to selectively output said analog image data, and
offset voltage avoiding means connected to said first capacitor for avoiding an offset voltage of said differential input type operation amplifier, and said control means comprises:
a first exclusive OR gate responsive to sample hold input clock and frame input clock for conducting logical operation,
first NAND gates connected in parallel to an output end of said exclusive OR gate and as many as the number of groups each composed of said third capacitor, and said fourth and fifth switches of one of said two switching means, second NAND gates as many as the number of groups each composed of said third capacitor, and said fourth and fifth switches of the other of said two switching means, and second exclusive OR gates each connected to each output end of said NAND gates and as many as the number of the NAND gates, said first exclusive OR gate supplying output to said NAND gates, as well as branching the output into two, and after inverting the polarity of only one of the outputs, supplying the two outputs as driving signals of said second and third switches to said digital-to-analog conversion means, said first NAND gates each receiving input of its corresponding digital image data and output of said exclusive OR gate, branching the output into two, and after inverting the polarity of only one of the outputs, supplying the two outputs as switching signals of said data output switching means to said data output switching means of said digital-to-analog conversion means, said second NAND gates each receiving input of its corresponding digital image data and sample hold input clock and supplying output to said second exclusive OR gates, and said second exclusive OR gates each receiving input of output of said second NAND gates and frame input clock, branching the output into two, and after inverting the polarity of only one of the outputs by said inverter, supplying the two outputs as switching signals of said data output switching means to said data output switching means of said digital-to-analog conversion means.

15. The image signal control circuit as set forth in claim 1, wherein said digital-to-analog conversion means comprises:
a differential input type operation amplifier having a positive input terminal connected to said first reference voltage terminal, a first switch connected in parallel between the output terminal and a negative input terminal of said differential input type operation amplifier, first capacitor having a predetermined capacitance and connected to the negative input terminal of said differential input type operation amplifier, first and second switches for selectively switching and supplying a gradation voltage value applied to said third reference voltage terminal or a voltage value applied to said first reference voltage terminal to said first capacitor, data output switching means correlated with a predetermined number of bits of digital image data allotted for selectively switching and supplying gradation voltage values applied to said second and third reference voltage terminals to the negative input terminal of said differential input type operation amplifier to selectively output said analog image data, a third switch and a second capacitor having a predetermined capacitance value connected in parallel between the output terminal and the negative input terminal of said differential input type operation amplifier, and offset voltage avoiding means connected to said first capacitor for avoiding an offset voltage of said differential input type operation amplifier, said two data output switching means each including groups, as many as the number corresponding to the number of bits of its corresponding digital image data, each group being composed of a third capacitor having a predetermined capacitance value and connected to the negative input terminal of said differential input type operation amplifier, a fourth switch for receiving input of a gradation voltage value of said second reference voltage terminal and supplying the same to the third capacitor, and a fifth switch for receiving input of a gradation voltage value of said third reference voltage terminal through said second switch and supplying the voltage value to the third capacitor, and said control means comprises:
a first exclusive OR gate responsive to sample hold input clock and frame input clock for conducting logical operation, first NAND gates connected in parallel to an output end of said exclusive OR gate and as many as the number of groups each composed of said third capacitor, and said fourth and fifth switches of one of said two switching means, second NAND gates as many as the number of groups each composed of said third capacitor, and said fourth and fifth switches of the other of said two switching means, and second exclusive OR gates each connected to each output end of said NAND gates and as many as the number of the NAND gates, said first exclusive OR gate supplying output to said NAND gates, as well as branching the output into two, and after inverting the polarity of only one of the outputs, supplying the two outputs as driving signals of said second and third switches to said digital-to-analog conversion means, said first NAND gates each receiving input of its corresponding digital image data and output of said exclusive OR gate, branching the output into two, and after inverting the polarity of only one of the outputs, supplying the two outputs as driving signals of its corresponding said fourth and fifth switches of said switching means to said switching means of said digital-to-analog conversion means, said second NAND gates each receiving input of its corresponding digital image data and sample hold input clock and supplying output to said second exclusive OR gates, and said second exclusive OR gates each receiving input of output of said second NAND gates and frame input clock, branching the output into two, and after inverting the polarity of only one of the outputs, supplying the two outputs as driving signals of its corresponding said fourth and fifth switches of said switching means to said data output switching means of said digital-to-analog conversion means.

16. The image signal control circuit as set forth in claim 14, wherein a length of a period from a rise to a fall of said frame input clock and a period from a fall to a rise of the same is each the same as a length of one cycle of said sample hold input clock.

17. The image signal control circuit as set forth in claim 15, wherein a length of a period from a rise to a fall of said frame input clock and a period from a fall to a rise of the same is each the same as a length of one cycle of said sample hold input clock, and said sample hold input clock is supplied as driving signals of said third switch and said offset voltage avoiding means.

18. An image signal control circuit for converting digital image data into analog image data and sending the data to a source driving circuit for driving a source line of a multi-gradation liquid crystal display, comprising:

a digital-to-analog conversion circuit having a first reference voltage terminal receiving a predetermined voltage value and second and third reference voltage terminals receiving a gradation voltage value for the voltage value applied to the first reference voltage terminal for outputting, as analog image data, one value of gradated analog gradation data obtained by a division of the gradation voltage, and a control circuit for receiving input of digital image data, sample hold input clock and frame input clock, wherein said control circuit is operative to switch the polarity of said analog image data output from said digital-to-analog conversion circuit at every frame period by controlling said digital-to-analog conversion circuit based on the values of said digital image data, said sample hold input clock and said frame input clock.

* * * * *

UNITED STATES PATENT AND TRADEMARK OFFICE
CERTIFICATE OF CORRECTION

PATENT NO.: 6,140,989
DATED: October 31, 2000
INVENTOR(S): Fumihiko KATO

It is certified that error(s) appears in the above-identified patent and that said Letters Patent is hereby corrected as shown below:

Abstract line 5 insert --.-- after "values"

Column 8, line 49, delete "$2^1$" insert --$2^a$--

Column 11, line 37, delete "$2^{-2}C$" insert --$2^{g-2}C$--

Column 12, line 19, delete "SWn" insert --SWβn--

Column 13, line 14, delete "lid" insert --11d--

Signed and Sealed this

Twenty-second Day of May, 2001

*Attest:*

NICHOLAS P. GODICI

*Attesting Officer*     *Acting Director of the United States Patent and Trademark Office*